(12) United States Patent
Mallinson

(10) Patent No.: US 9,595,931 B2
(45) Date of Patent: Mar. 14, 2017

(54) TWO DIFFERENTIAL AMPLIFIER CONFIGURATION

(71) Applicant: ESS Technology, Inc., Fremont, CA (US)

(72) Inventor: A. Martin Mallinson, Kelowna (CA)

(73) Assignee: ESS Technology, Inc., Milpitas, CA (US)

( * ) Notice: Subject to any disclaimer, the term of this patent is extended or adjusted under 35 U.S.C. 154(b) by 0 days.

(21) Appl. No.: 14/569,079

(22) Filed: Dec. 12, 2014

(65) Prior Publication Data

US 2016/0079943 A1  Mar. 17, 2016

Related U.S. Application Data

(60) Provisional application No. 62/049,926, filed on Sep. 12, 2014.

(51) Int. Cl.
*H03F 3/45* (2006.01)
*H03F 1/34* (2006.01)
*H03F 1/02* (2006.01)

(52) U.S. Cl.
CPC ....... *H03F 3/45076* (2013.01); *H03F 1/0205* (2013.01); *H03F 1/34* (2013.01); *H03F 3/4595* (2013.01); *H03F 3/45475* (2013.01); *H03F 3/45941* (2013.01); *H03F 2200/09* (2013.01); *H03F 2203/45114* (2013.01); *H03F 2203/45116* (2013.01); *H03F 2203/45138* (2013.01);
(Continued)

(58) Field of Classification Search
CPC ....................................................... H03F 3/45

USPC ..................... 330/69, 260, 99, 104
See application file for complete search history.

(56) References Cited

U.S. PATENT DOCUMENTS 3,551,839 A * 12/1970 Barker ............... G01N 30/8613
                                                      330/252
3,593,173 A *  7/1971 Nercessian ............... H03F 1/52
                                                      330/5

(Continued)

OTHER PUBLICATIONS

Analog Devices, "High Common-Mode Voltage, Single-Supply Difference Amplifier Data Sheet AD8202", Jan. 1, 2013, pp. 1-20, XP055200172, http://www.analog.com/media/en/technical-documentation/data-sheets/AD8202.pdf, p. 12, paragraph 8; figure 40.

(Continued)

*Primary Examiner* — Henry Choe
(74) *Attorney, Agent, or Firm* — Gard & Kaslow LLP

(57) ABSTRACT

An apparatus is disclosed for providing a common mode voltage to the inputs of a first differential amplifier which outputs the difference between two signals. A second differential amplifier receives the output of the first differential amplifier, and the output of the second differential amplifier is fed back to the inputs of the first differential amplifier as a common mode voltage. Since both inputs of the first differential amplifier receive the fed back common mode voltage, the first differential amplifier still outputs only the difference in the two signals, but the presence of the common mode voltage allows the first differential amplifier to operate with lower noise if the voltage levels of the inputs to the first differential amplifier vary. The second differential amplifier may be of significantly lower quality and cost than the first differential amplifier, without affecting the performance of the first differential amplifier.

11 Claims, 4 Drawing Sheets

(52) U.S. Cl.
CPC ............. *H03F 2203/45224* (2013.01); *H03F 2203/45336* (2013.01); *H03F 2203/45416* (2013.01); *H03F 2203/45446* (2013.01); *H03F 2203/45521* (2013.01); *H03F 2203/45528* (2013.01); *H03F 2203/45594* (2013.01)

(56) References Cited

U.S. PATENT DOCUMENTS

| | | | | |
|---|---|---|---|---|
| 3,737,798 | A | * | 6/1973 | Faraguet ................... H03F 1/56 330/51 |
| 4,032,857 | A | * | 6/1977 | Lum ....................... G01R 23/20 327/553 |
| 5,075,633 | A | * | 12/1991 | Bowers ................... H03F 3/347 330/144 |
| 6,034,566 | A | * | 3/2000 | Ohe ........................ H03F 3/191 330/305 |
| 7,253,680 | B2 | | 8/2007 | Laletin |

OTHER PUBLICATIONS

Gerstenhaber M et al: "Current Transmitter with Linear Voltage Transfer Rejects Ground Noise", Electronic Design, Penton Media, Cleveland, OH, US, vol. 48, No. 16, Aug. 7, 2000, p. 121/122, XP001076485, ISSN: 0013-4872, figure 1.

* cited by examiner

TWO DIFFERENTIAL AMPLIFIER CONFIGURATION

This application claims priority from Provisional Application No. 62/049,926, filed Sep. 15, 2014, which is incorporated by reference herein in its entirety.

FIELD OF THE INVENTION

The present invention relates generally to amplifiers, and more particularly to differential amplifiers.

BACKGROUND OF THE INVENTION

In some applications, is it desirable to convert a differential one represented by the difference between two voltages, to a single ended signal, i.e. a varying voltage on a single wire that represents the signal. (There is typically another wire representing ground.) One such application is to convert the differential output of a digital-to-analog converter (DAC) to a single ended signal. One way to accomplish this is by the use of a differential amplifier.

A differential amplifier is a type of electronic amplifier that is well known in the art; it amplifies the difference between two voltages but does not amplify the particular voltages. An operational amplifier, or op-amp, may be used to make a differential amplifier having very high differential-mode gain, very high input impedance, and low output impedance.

A well known example of a differential amplifier made with an op-amp that converts a differential input to a single ended output is shown in FIG. 1. In circuit 100, two inputs V1 and V2 are applied to an op amp 102 through resistors R1 and R2. Op amp 102 provides the amplified difference of the signals V1 and V2 as the output Out, which is fed back to the inverting input of op amp 102 through resistor R3. The non-inverting input of op amp 102 is coupled to ground through resistor R4. The values of R3 and R4 are typically equal to each other. Due to the use of negative feedback (i.e., the feedback of the output to the inverting input of op amp 102), such an op-amp differential amplifier may be made with predictable and stable gain. In some cases, and as is known in the art, certain types of differential amplifiers ma even include several simpler differential amplifiers.

FIG. 2 shows one particular embodiment of such a differential amplifier used to convert the output of a DAC to a single ended signal, that is made by ESS Technology, Inc. In circuit 200, the output of a DAC 202 (indicated by the dashed line) is two output signals V1 and V2. When placed into a larger circuit, DAC 202 acts like an equivalent differential voltage source providing voltages V1 and V2 with output resistances R1 and R2 of 781 ohms ($\Omega$) each, and is thus represented as such in FIG. 2.

As in circuit 100 of FIG. 1, op amp 204 receives the two voltages as inputs and provides the amplified difference as the output Out. Resistor R3 again connects Out to the inverting input of op amp 204, while resistor R4 connects the non-inverting input of op amp 204 to ground. In practice, resistors R3 and R4 again have equal values, and each have resistances of 1330$\Omega$ (i.e., 1.33 kilohms or 1.33 k$\Omega$). As will be apparent to one of skill in the art, the gain of the circuit will differ depending upon the value of resistors R3 and R4, and that resistor value may thus be selected to obtain a desired RMS value of Out.

The circuit 200 of FIG. 2 is relatively inexpensive at it requires only a single op amp 204, as well as a few resistors. However, circuit 200 has a limitation in that the output voltages of DAC 202 may change, which in turn causes the inputs to op amp 204, i.e., the voltages that appear on the right hand side of equivalent resistances R1 and R2, to also change with signal level so that they are thus not constant relative to ground. This change in the output voltages of DAC 202 may cause distortion.

It is known that the distortion caused by the varying DAC output voltage change may be reduced by applying as common mode voltage to the inputs to op amp 204, so that the DAC output appears to have an approximately constant voltage regardless of the signal. A typical way to do this is known in the art and is shown in circuit 300 in FIG. 3. Again DAC 302 appears as a differential voltage source with output voltages of V1 and V2, and output resistances R1 and R2 of 781$\Omega$ each. Op amp 304 again receives the outputs of DAC 302 and provides an amplified differential voltage at Out. The voltage Out is again fed back to the inverting input of op amp 304 through resistor R3 of 1.33 k$\Omega$, and a similar resistor R4 of 1.33 k$\Omega$ again connects the non-inverting input of op amp 304 to ground.

Now, however, the voltages V1 and V2 from DAC 302 are not input directly from resistors R1 and R2 to op amp 304, but rather pass through two additional differential amplifiers that include op amps 306 and 308, and resistors R5 and R6, respectively. The non-inverting inputs of op amps 306 and 308 are connected to a virtual ground Cm, while the inverting inputs receive the voltages V1 and V2 at their respective inverting inputs, and resistors R5 and R6 provide feedback from the outputs of op amps 306 and 308 to their inverting inputs.

The two additional op amps 306 and 308 pass through the difference between each of V1 and V2 and the virtual ground Cm, and thus function as virtual ground current to voltage converters to provide a common mode voltage to op amp 304 along with the differential voltage signal from DAC 302. The outputs of op amps 306 and 308 are passed through resistors R7 and R8 to the inputs of op amp 304, which as in circuit 200 of FIG. 2 provides an open ended signal from the differential signal. Since each input to op amp 304 contains the same common mode voltage, that voltage cancels out and the output Out is again the difference between V1 and V2.

The use of the additional op amps 306 and 308 causes the outputs of DAC 304 to now have a constant common mode voltage level regardless of signal level, which results in less distortion. However, the downside to this configuration is that op amps 306 and 308 typically have the same specifications and operating parameters as op amp 304, and since the op amps are the most expensive part of the circuit (not including DAC 302), the cost of circuit 300 of FIG. 3 is thus about three times the cost of circuit 200 of FIG. 2.

It is thus desirable to find a simple solution that will cause the DAC outputs to have a constant voltage but that is less expensive than the known configuration of FIG. 3 having three expensive op amps.

SUMMARY OF THE INVENTION

A circuit is disclosed which provides a common mode voltage to the inputs of a differential amplifier and is less costly than the typical prior art solution.

One embodiment discloses a circuit, comprising: a first differential amplifier, comprising: a first operational amplifier having an inverting input for receiving a first part of a differential signal and a non-inverting input for receiving a second part of the differential signal, and an output for outputting a single ended signal representing the difference between the two parts of the differential signal; a first resistor coupled to the output of the first operational amplifier and the inverting input of the first operational amplifier so as to create a negative feedback loop around the first operational amplifier; and a second resistor coupled to the non-inverting input of the first operational amplifier and to a ground; a second differential amplifier, comprising: a second operational amplifier having an inverting input and a non-inverting input, the non-inverting input coupled to the ground; a third resistor coupled to the output of the first operational amplifier and to the inverting input of second operational amplifier; and a fourth resistor coupled to the output of the second operational amplifier and the inverting input of the second operational amplifier so as to create a negative feedback loop around the second operational amplifier; a fifth resistor coupled to the output of the second operational amplifier and the inverting input of the first operational amplifier; and a sixth resistor coupled to the output of the second operational amplifier and the non-inverting input of the first operational amplifier.

Another embodiment discloses a circuit, comprising: a first differential amplifier having an inverting input for receiving a first part of a differential signal and a non-inverting input for receiving a second part of the differential signal, and an output for outputting a single ended signal representing the difference between the two parts of the differential signal; a second differential amplifier having an inverting input coupled to the output of the first differential amplifier and a non-inverting input coupled to the ground; a first resistor coupled to the output of the second differential amplifier and the inverting input of the first differential amplifier; and a second resistor coupled to the output of the second differential amplifier and the non-inverting input of the first differential amplifier.

DETAILED DESCRIPTION OF THE INVENTION

Described herein is a circuit for providing a common mode voltage to the inputs of a first differential amplifier. The described circuit uses a second differential amplifier of lower quality than the first differential amplifier, rather than the prior art solution of two additional differential amplifiers of the same quality as the first differential amplifier.

Figure 2:
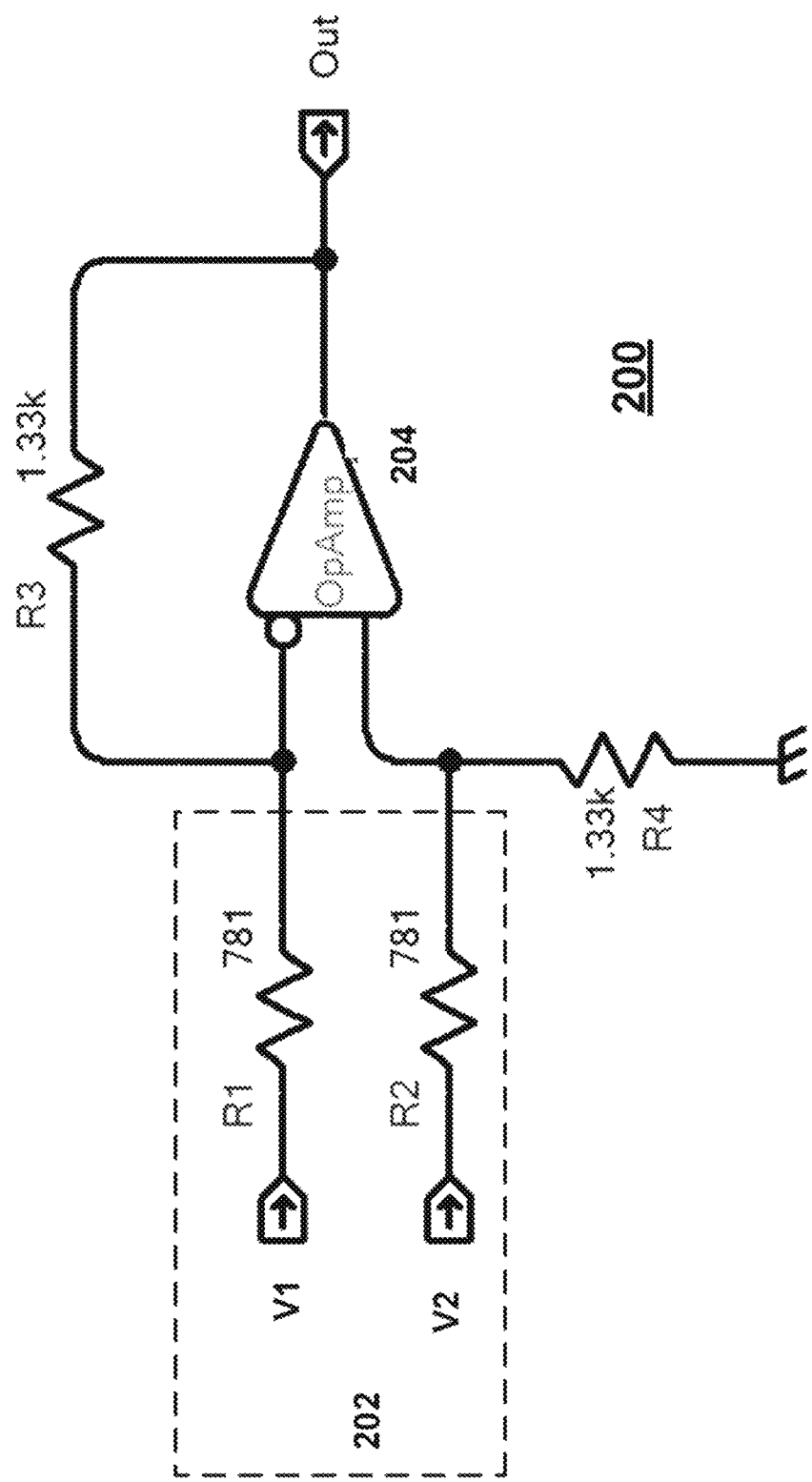
FIG. 2 is a schematic diagram of a typical prior art differential amplifier circuit that may be used to convert the differential output of a DAC to a single ended signal.
Figure 3:
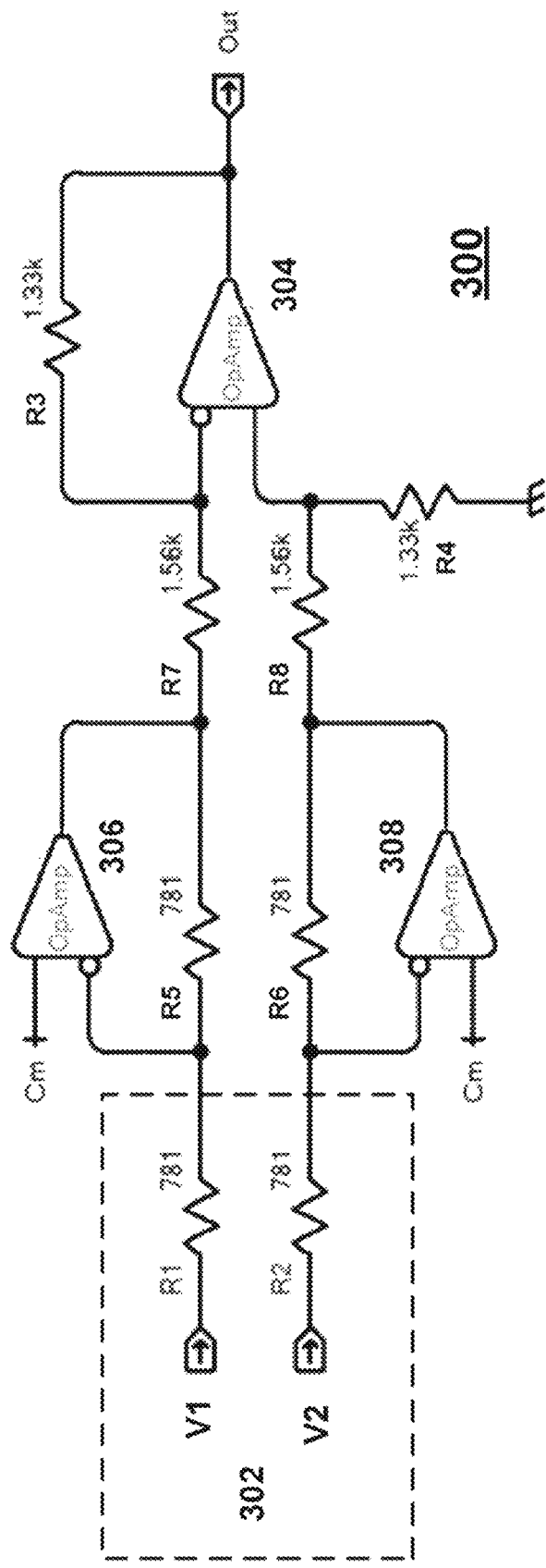
FIG. 3 is a schematic diagram of another prior art differential amplifier circuit that may be used to convert the differential output of a DAC to a single ended signal while also providing common mode voltages to the DAC as in the prior art.

As above, when a typical differential amplifier having an op-amp such as is shown in FIG. 2 is used to convert the output of a DAC to a single ended signal, there is often distortion due to the change in signal level of the DAC output. The traditional solution is to add two more differential amplifiers to act as virtual ground current to voltage converters to provide a common mode voltage so that the op-amp receiving the differential signal will see a more constant voltage regardless of the signal level, as shown in FIG. 3. However, since all three op-amps in such a configuration typically have the same specifications and operating parameters, and since the op-amps are the most expensive parts of such a circuit, this has the effect of nearly tripling the cost of the circuit.

In one embodiment, an alternative solution is presented in which a common mode signal is used to keep the inputs to the op amp receiving the differential signal at a constant level. However, unlike the prior art, in this embodiment the common mode signal is provided by a single second differential amplifier that receives the single ended output signal (from the op amp receiving the differential signal), and provides a common mode signal back to both inputs of the op amp from which it received that output signal. This single second differential amplifier is used rather than the two virtual ground current to voltage converters of FIG. 3.

The op amp contained in the second differential amplifier may be of lower quality, and thus cost, than the op amp receiving the differential signal. Thus, such a configuration is both simpler and less expensive than that of circuit 300 in FIG. 3, as only one less expensive op amp is used, rather than the two additional op amps of similar cost used in circuit 300.

Figure 4:
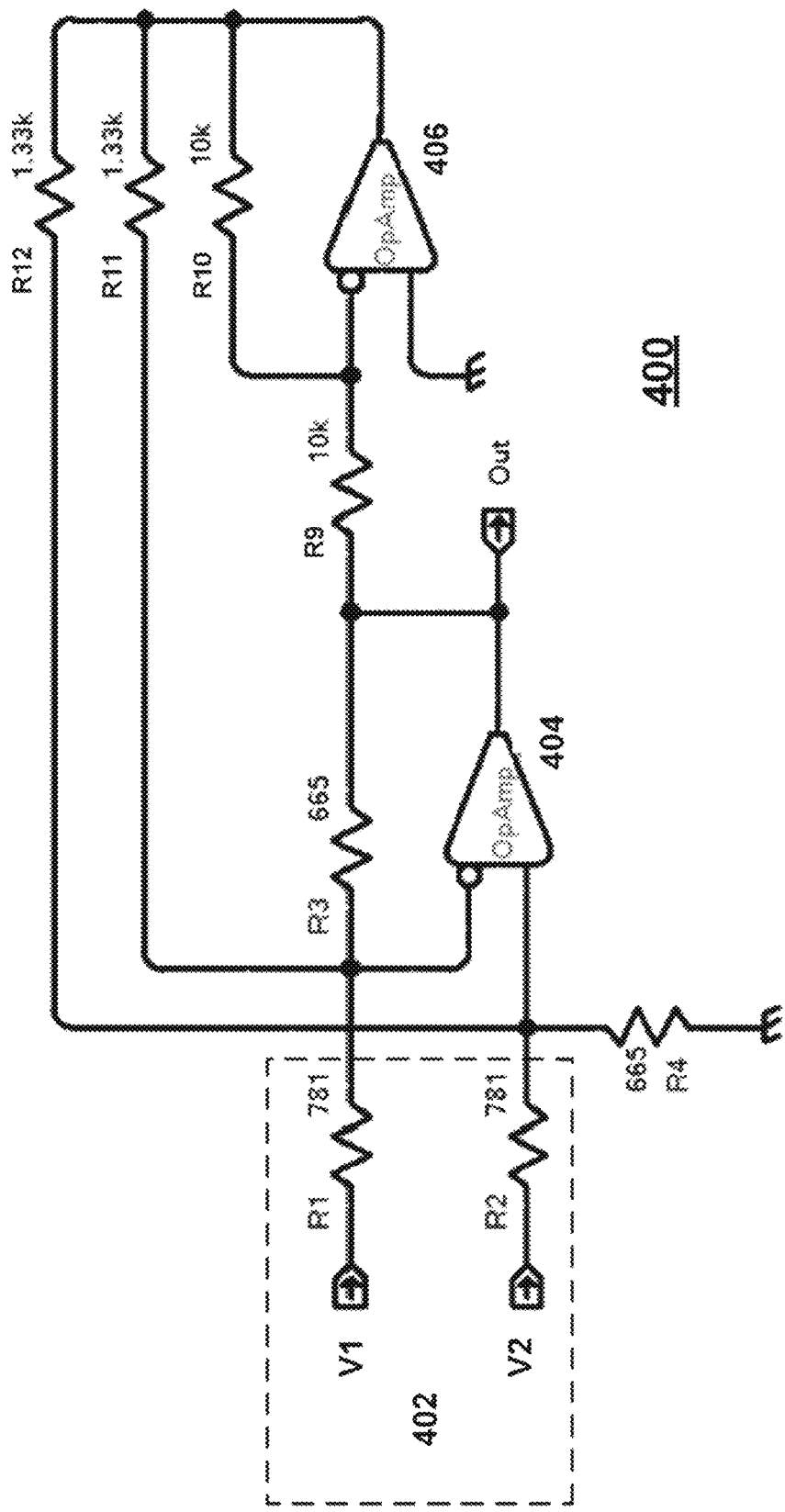
FIG. 4 is a schematic diagram of a differential amplifier circuit that may be used to convert the differential output of a DAC to a single ended signal according to one embodiment.

An example of this is shown by circuit 400 in FIG. 4. As with the prior art circuits 200 of FIG. 2 and 300 of FIG. 3, DAC 402 provides outputs that appear as a differential signal of voltages V1 and V2 passed through two resistors R1 and R2 of 781Ω each. Op amp 404 receives V1 and V2 as inputs, and provides a single ended output Out. Out is fed back to the inverting input of op amp 404 through resistor R3, while the non-inverting input of op amp 404 is connected to ground through resistor R4. As illustrated in this example, R3 and R4 have resistances of 665Ω each.

To provide a constant level at the inputs of op amp 404, rather than the additional virtual ground current to voltage converters of circuit 300 of FIG. 3, circuit 400 contains a second differential amplifier. The second differential amplifier contains op amp 406, input resistor R9 and feedback resistor R10. At its inverting input, op amp 406 receives the output Out from op amp 404 through input resistor R9, as well as its own output through feedback resistor R10; as illustrated, both resistors R9 and R10 each have a resistance of 10 kΩ. The non-inverting input of op amp 406 is connected to ground.

The output of op amp 406 is also fed back to both inputs of op amp 404 through resistors R11 and R12 respectively. In the illustrated embodiment, resistors R11 and R12 each have a resistance of 1.33 kΩ, so that the voltage fed back to the each of the inputs of op-amp 404 is the same. Because the same output from op amp 406 is fed back as a common mode voltage to both inputs of op amp 404, the additional voltage on each input of op amp 404 cancels out the voltage on the other input of op amp 404 when op amp 404 converts the differential input to the single ended output Out. Thus, there is no change to the differential signal to be converted by op amp 404, the difference between the input voltages V1 and V2 received from DAC 402.

However, the common mode voltage now present at the inputs to op amp 404 that is fed back from the output of op amp 406 affects the voltage present at the inputs of op amp 404 in exactly the opposite way from the variations in signal from DAC 402. Thus, the fed back voltage from op amp 406 now makes op amp 404 operate as if the input voltage is substantially fixed. This thus results in, essentially the same effect as the virtual ground current to voltage converters of FIG. 3, i.e., the inputs to op amp 404 are of a generally constant voltage regardless of variations in the absolute voltage levels of V1 and V2. Thus, the distortion caused by variation in the signals from DAC 402 is reduced in a similar fashion to that achieved by circuit 300 in FIG. 3.

It will be apparent that circuit 400 of FIG. 4 is likely to be less expensive than circuit 300 of FIG. 3, if for no other reason than that circuit 400 only uses two op amps 404 and 406, as compared to the three op amps 304, 306 and 308 of circuit 300 (in addition to the various resistors). However, there is a further cost saving, as op amp 406 of FIG. 4 may also be of significantly lower performance, and thus cost, than op amps 306 and 308 of FIG. 3.

One of the parameters of performance of an op amp is what is known in the art as the equivalent noise resistance, or "$R_{NOISE}$." $R_{NOISE}$ allows designers to think about the noise in a voltage signal output by an op amp with minimal mathematics. More specifically, $R_{NOISE}$ is a measure of the equivalent size of a resistor that would be needed to create a given amount of noise in a signal at room temperature. $R_{NOISE}$ for a noise level of 1 nanovolt at room temperature is about 50Ω. In an application such as a typical DAC, a value of $R_{NOISE}$ of 1 kΩ equivalent is generally considered to be good, while an $R_{NOISE}$ of 1 megohm (1 MΩ) represents about 30 times more noise.

In the embodiment of circuit 200 of FIG. 2 made by ESS Technology, Inc., op amp 202 has an $R_{NOISE}$ of about 40 kΩ. Similarly, in circuit 300 of FIG. 3, since the op amps 306 and 308 are part of the virtual ground current to voltage converters in the path of the signal from DAC 302, it is desirable that they not add additional noise to the overall circuit. Thus, op amps 306 and 308 have a noise level, and thus an $R_{NOISE}$, that is similar to the noise level of op amp 304. Op amps 306 and 308 accordingly will typically be of the same quality and cost as op amp 304.

By contrast, in circuit 400, the output of op amp 406 in circuit 400 is again fed back to both inputs of op amp 404 in common mode and thus will not affect the output of op amp 404. Thus, it is not necessary for op amp 406 to be of similar quality and performance to op amp 404; rather, op amp 406 may be of significantly lower quality without affecting the performance of op amp 404 and thus circuit 400. In one embodiment, the equivalent $R_{NOISE}$ of op amp 406 is 1 MΩ rather than the 40 kΩ of op amp 404.

One of skill in the art will appreciate that it is significantly easier, and thus cheaper, to manufacture an op amp with an $R_{NOISE}$ value of 1 MΩ as compared to one with an $R_{NOISE}$ of 40 kΩ, so that op amp 406 will be less expensive than op amps 306 or 308 of FIG. 3. Thus, as compared to circuit 300 of FIG. 3, circuit 400 of FIG. 4 not only has the advantage of needing only two op amps 404 and 406, rather than the three op amps 304, 306 and 308 of circuit 300, but op amp 406 may be significantly cheaper to make than either op amp 306 or 308. For both of these reasons, circuit 400 of FIG. 4 is significantly cheaper to manufacture than circuit 300 of FIG. 3.

Figure 1:
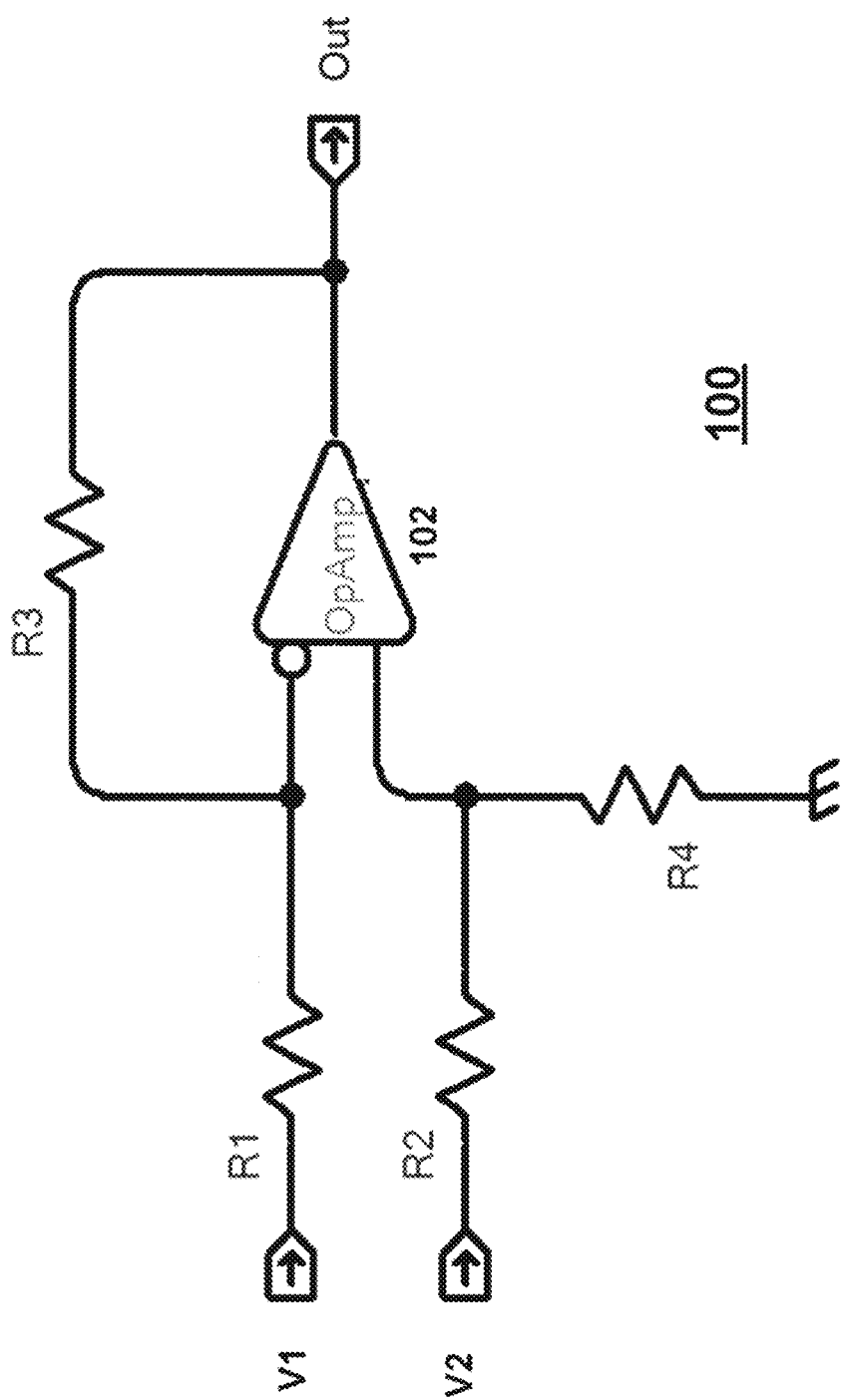
FIG. 1 is a schematic diagram of a typical prior art differential amplifier circuit such as is used to convert a differential input signal to a single ended signal.

As with the prior art circuits of FIGS. 1 and 2, resistors R3 and R4 of FIG. 4 will typically be of the same values, and will be determined by the desired root mean square (RMS) of the voltage of output Out. One common desired RMS output is 2 volts, and in one embodiment, using a DAC 402 which is intended to output a voltage of between 0 and 3.3 volts, R3 and R4 should be 665Ω each.

For the second differential amplifier of FIG. 4, it is preferable that the value of R9 be the same as that of R10, and one of skill in the art will appreciate that these may be of any reasonable value that is not so large as to limit the bandwidth. For example, R9 and R10 may typically be 5 kΩ or 10 kΩ each without causing any bandwidth problems.

To provide the common mode voltage, the values of R11 and R12 should also be equal to each other, and will typically be twice the value of R3 or R4. Thus, in the illustrated embodiment, with R3 and R4 set to 665Ω each to obtain the desired RMS output of 2 volts, R11 and R12 will be twice that value, or 1330Ω (or 1.33 kΩ) each.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, it is expected that the described apparatus may be implemented in numerous ways, including as a hard-wired circuit or embodied in a semiconductor device. Where elements are shown as connected, they may in some embodiments be coupled to each other through another element, for example, through another resistor. Different parameters for the op amps contained in the differential amplifiers may be used, as well as different resistor values, depending on the particular application. One of skill in the art will appreciate how to determine what op amps may be used, and, what resistor values will be appropriate for a specific intended application.

These and other variations upon the embodiments are intended to be covered by the present disclosure, which is limited only by the appended claims.

What is claimed is:

1. A circuit comprising:
    a first differential amplifier, comprising:
        a first operational amplifier having an inverting input for receiving a first part of a differential signal represented by the difference between two voltages and a non-inverting input for receiving a second part of the differential signal, and an output for outputting a single ended signal representing the difference between the two parts of the differential signal;
        a first resistor coupled to the output of the first operational amplifier and the inverting input of the first operational amplifier so as to create a negative feedback loop around the first operational amplifier; and
        a second resistor coupled to the non-inverting input of the first operational amplifier and to a ground;
    a second differential amplifier, comprising:
        a second operational amplifier having an inverting input and a non-inverting input, the non-inverting input coupled to the ground;
        a third resistor coupled to the output of the first operational amplifier and to the inverting input of second operational amplifier; and
        a fourth resistor coupled to the output of the second operational amplifier and the inverting input of the second operational amplifier so as to create a negative feedback loop around the second operational amplifier;
    a fifth resistor coupled to the output of the second operational amplifier and the inverting input of the first operational amplifier in a first feedback loop; and
    a sixth resistor coupled to the output of the second operational amplifier and the non-inverting input of the first operational amplifier in a second feedback loop which is independent of the first feedback loop.

2. The circuit of claim 1 wherein each operational amplifier has an equivalent noise resistance, and the equivalent noise resistance of the second operational amplifier is significantly greater than the equivalent noise resistance of the first operational amplifier.

3. The circuit of claim 2 wherein the equivalent noise resistance of the second operational amplifier is more than 10 times the equivalent noise resistance of the first operational amplifier.

4. The circuit of claim 1 wherein the first and second resistors have resistances substantially equal to each other.

5. The circuit of claim 1 wherein the third and fourth resistors have resistances substantially equal to each other.

6. The circuit of claim 1 wherein the fifth and sixth resistors have resistances substantially equal to each other.

7. The circuit of claim 4 wherein the fifth and sixth resistors have resistances substantially equal to twice the resistances of the first and second resistors.

8. A circuit comprising:
a first differential amplifier having an inverting input for receiving a first part of a differential signal represented by the difference between two voltages and a non-inverting input for receiving a second part of the differential signal, and an output for outputting a single ended signal representing the difference between the two parts of the differential signal;
a second differential amplifier having an inverting input coupled to the output of the first differential amplifier and a non-inverting input coupled to the ground;
a first resistor coupled to the output of the second differential amplifier and the inverting input of the first differential amplifier in a first feedback loop; and
a second resistor coupled to the output of the second differential amplifier and the non-inverting input of the first differential amplifier in a second feedback loop which is independent of the first feedback loop.

9. The circuit of claim 8 wherein each differential amplifier has an equivalent noise resistance, and the equivalent noise resistance of the second differential amplifier is significantly greater than the equivalent noise resistance of the first differential amplifier.

10. The circuit of claim 9 wherein the equivalent noise resistance of the second differential amplifier is more than 10 times the equivalent noise resistance of the first differential amplifier.

11. The circuit of claim 8 wherein the first and second resistors have resistances substantially equal to each other.

\* \* \* \* \*